(12) United States Patent
Yokoyama et al.

(10) Patent No.: US 9,406,557 B2
(45) Date of Patent: Aug. 2, 2016

(54) COPPER WIRING FORMING METHOD WITH RU LINER AND CU ALLOY FILL

(71) Applicant: TOKYO ELECTRON LIMITED, Minato-ku, Tokyo (JP)

(72) Inventors: Osamu Yokoyama, Nirasaki (JP); Cheonsoo Han, Nirasaki (JP); Takashi Sakuma, Nirasaki (JP); Chiaki Yasumuro, Nirasaki (JP); Tatsuo Hirasawa, Nirasaki (JP); Tadahiro Ishizaka, Nirasaki (JP); Kenji Suzuki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/316,251

(22) Filed: Jun. 26, 2014

(65) Prior Publication Data

US 2015/0004784 A1 Jan. 1, 2015

(30) Foreign Application Priority Data

Jun. 28, 2013 (JP) ................................ 2013-136366

(51) Int. Cl.
*H01L 21/768* (2006.01)
*H01L 23/532* (2006.01)
*H01L 21/288* (2006.01)

(52) U.S. Cl.
CPC .... *H01L 21/76877* (2013.01); *H01L 21/76834* (2013.01); *H01L 21/76843* (2013.01); *H01L 21/76867* (2013.01); *H01L 21/76876* (2013.01); *H01L 23/53233* (2013.01); *H01L 23/53238* (2013.01); *H01L 21/2885* (2013.01); *H01L 2924/0002* (2013.01)

(58) Field of Classification Search
CPC ....................... H01L 21/76877; H01L 21/7683
See application file for complete search history.

(56) References Cited

U.S. PATENT DOCUMENTS

| | | | |
|---|---|---|---|
| 7,799,681 B2 | 9/2010 | Suzuki et al. | |
| 2005/0079703 A1* | 4/2005 | Chen | C23F 3/04 438/633 |
| 2006/0240187 A1* | 10/2006 | Weidman | C23C 16/0272 427/248.1 |
| 2014/0030886 A1* | 1/2014 | Fukushima et al. | 438/653 |

FOREIGN PATENT DOCUMENTS

| | | |
|---|---|---|
| JP | 2006148075 A | 6/2006 |
| JP | 2011023456 A | 2/2011 |
| JP | 2012504347 A | 2/2012 |
| WO | WO 2012133400 A1 * | 10/2012 |

OTHER PUBLICATIONS

Nogami, T., et al.; "High Reliability 32 nm Cu/ULK BEOL Based on PVD CuMn Seed, and its Extendibility", IEDM, pp. 764-767, 2010.

* cited by examiner

*Primary Examiner* — John P Dulka
(74) *Attorney, Agent, or Firm* — Nath, Goldberg & Meyer; Jerald L. Meyer

(57) ABSTRACT

Provided is a method of forming a copper (Cu) wiring in a recess formed to have a predetermined pattern in an insulating film formed on a surface of a substrate. The method includes: forming a barrier film at least on a surface of the recess, the barrier film serving as a barrier for blocking diffusion of Cu; forming a Ru film on the barrier film by Chemical Mechanical Deposition (CVD); forming a Cu alloy film on the Ru film by Physical Vapor Deposition (PVD) to bury the recess; forming a Cu wiring using the Cu alloy film buried in the recess; and forming a dielectric film on the Cu wiring.

8 Claims, 13 Drawing Sheets

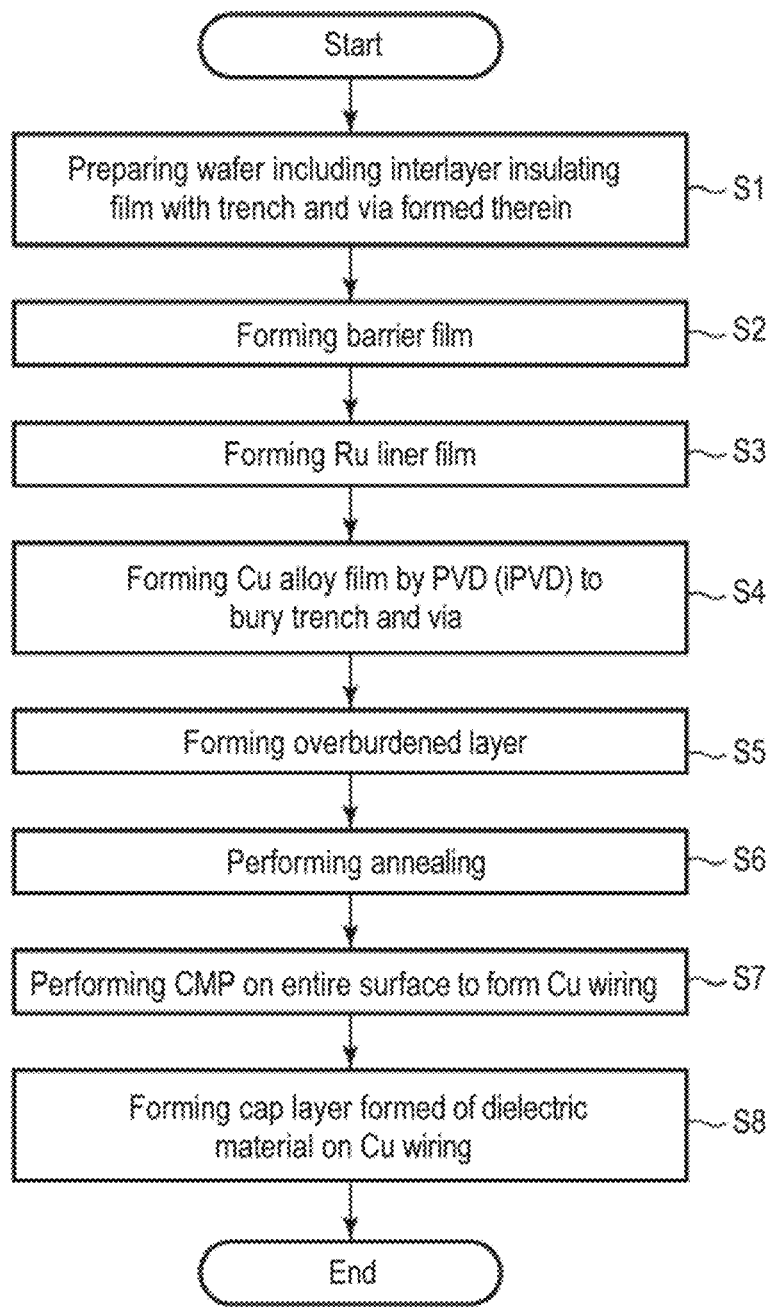

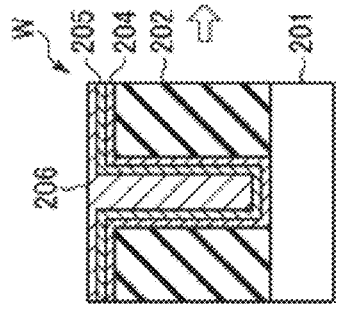
FIG. 2A
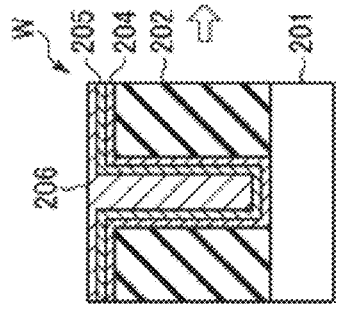
FIG. 2B
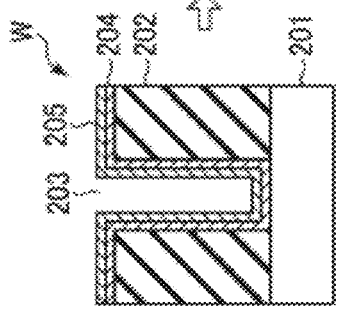
FIG. 2C
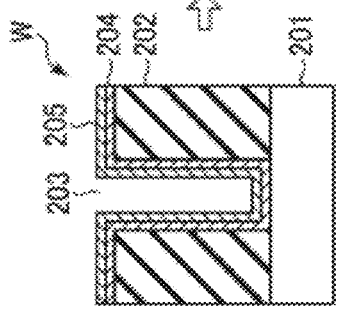
FIG. 2D
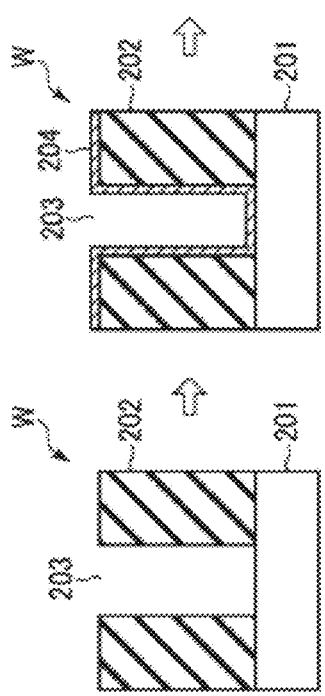
FIG. 2E
FIG. 2F
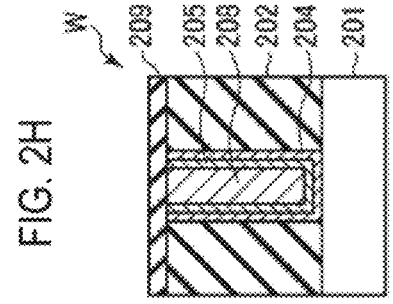
FIG. 2G
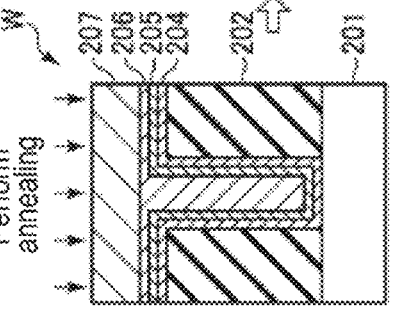
FIG. 2H

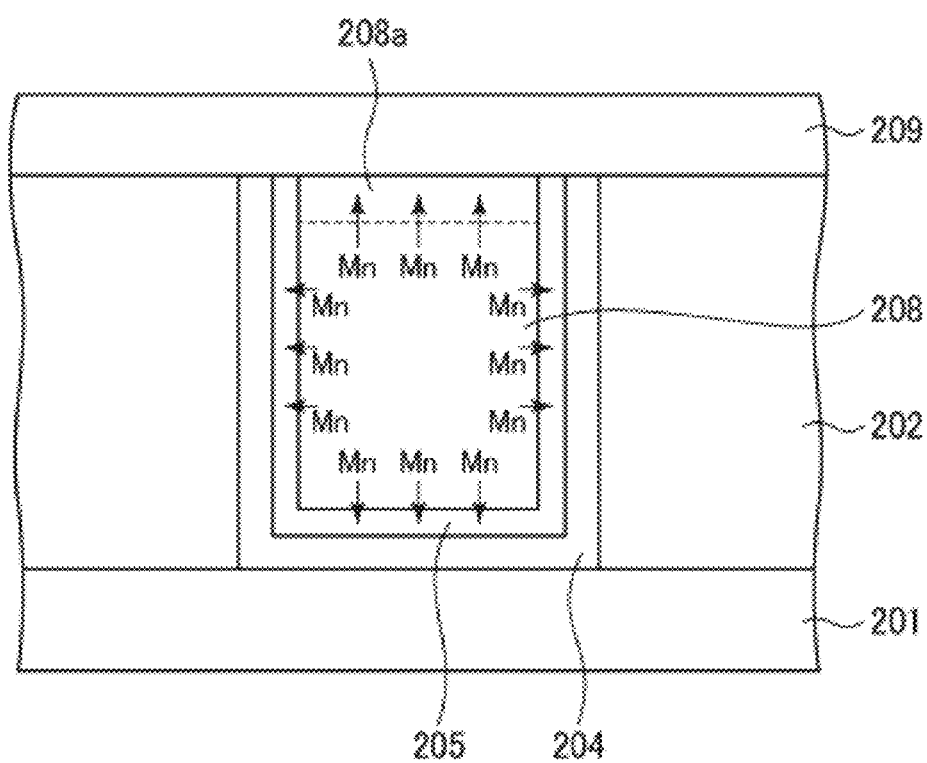

COPPER WIRING FORMING METHOD WITH RU LINER AND CU ALLOY FILL

CROSS-REFERENCE TO RELATED APPLICATION

This application claims the benefit of Japanese Patent Application No. 2013-136366, filed on Jun. 28, 2013, in the Japan Patent Office, the disclosure of which is incorporated herein in its entirety by reference.

TECHNICAL FIELD

The present disclosure relates to a method of forming a copper (Cu) wiring in a recess such as a trench or hole formed in a substrate.

BACKGROUND

Semiconductor devices are manufactured by repeatedly performing various processes such as a film-forming process, an etching process and the like on a semiconductor wafer. According to recent demands for high speed of a semiconductor device, miniaturization of a wiring pattern, and high integration of a semiconductor device, a wiring requires a reduction in resistance of a wiring (improvement in conductivity) and an improvement in electro-migration resistance.

In order to cope with this point, copper (Cu) that has both higher conductivity (lower resistance) and better electro-migration resistance than aluminum (Al) or tungsten (W) which have been used for wirings.

A method of forming a Cu wiring was proposed which includes: forming a barrier film formed of tantalum (Ta), titanium (Ti), tantalum nitride (TaN), titanium nitride (TiN), or the like on an entire interlayer dielectric film with a trench or hole formed therein using a plasma sputtering as PVD (Physical Vapor Deposition); forming a Cu seed film on the barrier film using plasma sputtering; plating a copper film on the copper seed film to completely bury the trench or hole; and removing the extra copper thin film and the extra barrier film on the surface of the wafer using CMP (Chemical Mechanical Polishing).

However, as design rules of semiconductor devices are gradually miniaturized, a current density is increased. This fails to sufficiently secure an electro-migration resistance even though Cu is used as a material of the wiring. Therefore, a demand is increased for developing a technology which improves the electro-migration resistance of the Cu wiring.

To meet such a demand, there has been proposed a technology for improving an adhesion between a Cu wiring and a dielectric cap (SiCN cap) film formed thereon by segregating alloy components such as Mn or Al toward a region between the Cu wiring and the dielectric cap film using a Cu alloy such as Cu—Mn or Cu—Al as a seed layer, instead of a Cu seed film. In addition, there has been proposed a technology for improving an adhesion between the Cu wiring and the dielectric cap film by selectively forming a metal cap on a surface of the Cu wiring.

However, alloy components contained in the Cu alloy used as the seed layer and impurities contained in the Cu-plated film are introduced into the Cu wiring, thus resulting in an increased wiring resistance.

In addition, forming a metal cap on the Cu wiring requires selectively forming the metal cap only on the Cu wiring in order to prevent a leak current from being generated between wirings. As such, an increased number of processes is required to secure the selectivity, thus leading to an increase in cost.

In addition, as described above, as the design rules of the semiconductor devices are gradually made finer, a width of a trench or a diameter of a hole amounts to tens of nm. When the barrier film or the seed film is formed in a narrow recess such as a trench or hole using plasma sputtering, and subsequently, the trench or hole is buried by the Cu plating, the trench or the hole is not completely buried with Cu, thereby generating voids.

SUMMARY

Some embodiments of the present disclosure provide a copper (Cu) wiring forming method which is capable of preventing a wiring resistance or the number of processes from being increased and including a good burying property when the Cu wiring is formed in a recess such as a trench or hole, thus obtaining a Cu wiring having high electro-migration resistance.

According to an aspect of the present disclosure, provided is a method of forming a copper (Cu) wiring in a recess formed to have a predetermined pattern in an insulating film formed on a surface of a substrate, which includes: forming a barrier film at least on a surface of the recess, the barrier film serving as a barrier for blocking diffusion of Cu; forming a Ru film on the barrier film by Chemical Mechanical Deposition (CVD); forming a Cu alloy film on the Ru film by Physical Vapor Deposition (PVD) to bury the recess; forming a Cu wiring using the Cu alloy film buried in the recess; and forming a dielectric film on the Cu wiring.

According to another aspect of the present disclosure, provided is a non-transitory computer-readable storage medium operating in a computer and storing a program for controlling a Cu wiring forming system, wherein when the program is executed by the computer, the program controls the Cu wiring forming system to perform the aforementioned method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart showing a Cu wiring forming method according to an embodiment of the present disclosure.

FIGS. 2A to 2H are cross-sectional views illustrating the Cu wiring forming method according to the embodiment of the present disclosure.

FIG. 3 is a schematic view showing a state where components (Mn) contained in a CuMn alloy film are segregated toward an interface between a dielectric cap layer and a Cu wiring, and in a Ru film formed around the Cu wiring.

DETAILED DESCRIPTION

Figure 4:
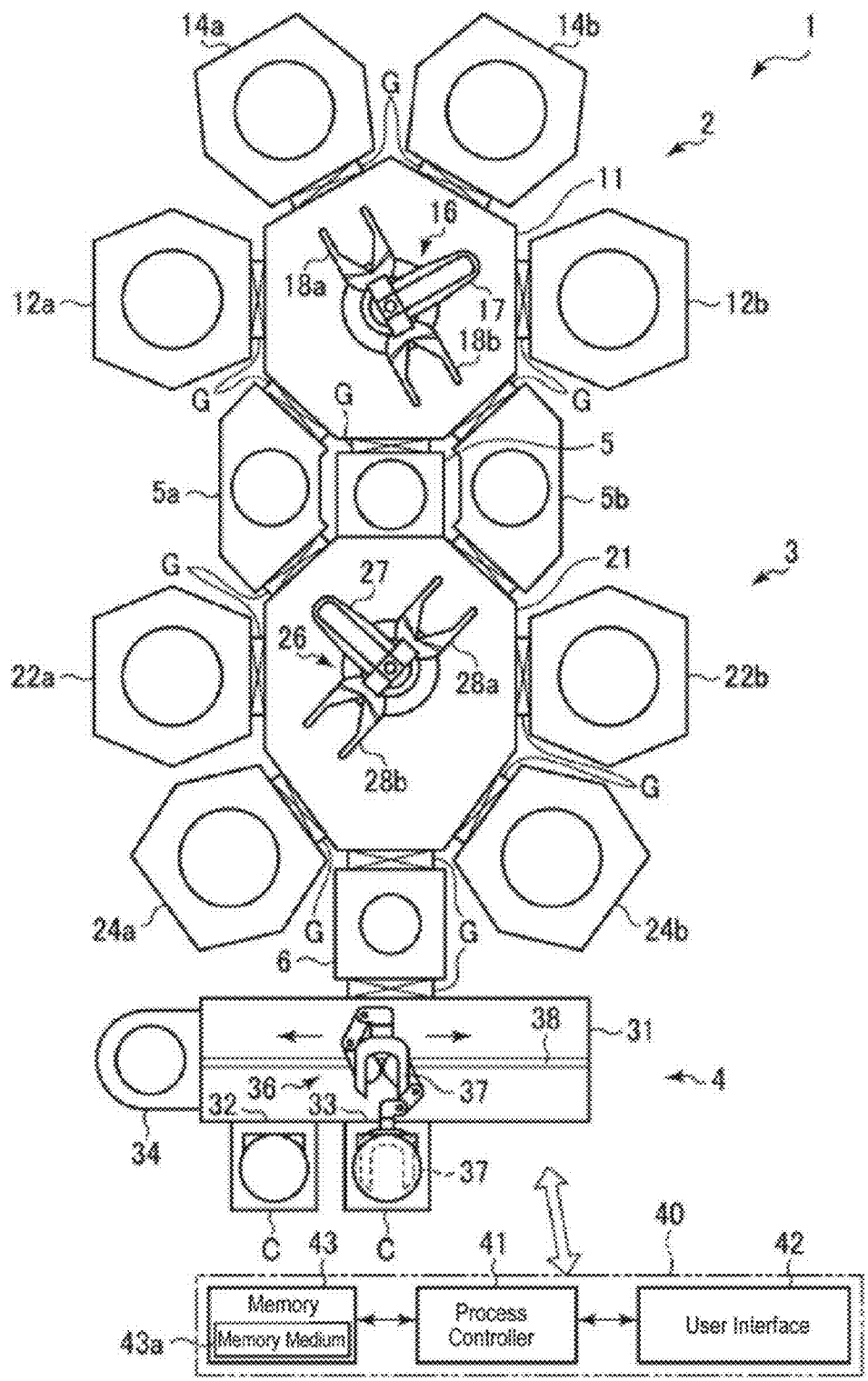
FIG. 4 is a plane view showing an example of a multi-chamber type film-forming system for performing the Cu wiring forming method according to the embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A copper (Cu) wiring forming method according to an embodiment of the present disclosure will be described with reference to FIG. 1 and FIGS. 2A to 2H.

In this embodiment, a semiconductor wafer (hereinafter, simply referred to as a "wafer") W is provided in which an interlayer dielectric film 202 such as a $SiO_2$ film or a low-k (SiCO, SiCOH or the like) film, which is formed on a base structure 201 (detailed structure is not shown), and a trench 203 and a via (not shown) for connecting to a lower layered wiring are formed in the interlayer dielectric film 202 in a predetermined pattern (Operation 51; see FIG. 2A). The wafer W may include a wafer in which moisture present on a surface of an insulating film or foreign matter formed upon etching/ashing are removed by a degassing or pre-cleaning process.

Subsequently, a barrier film 204 is formed on the entire surface of the wafer W including the trench 203 and the via such that a copper (Cu) film is used as a shield to prevent diffusion thereof (Operation S2; see FIG. 2B).

In some embodiments, the barrier film 204 may be formed of a material having a high barrier characteristic against Cu and low resistance. Examples of the barrier film 204 may include a Ti film, a TiN film, a Ta film, a TaN film, or a Ta/TaN film. Alternatively, examples of the barrier film 204 may include a TaCN film, a W film, a WN film, a WCN film, a Zr film, a ZrN film, a V film, a VN film, a Nb film, a NbN film, or the like. Resistance of a Cu wiring decreases as the volume of Cu to be buried in the trench 203 and a hole increases. As such, the barrier film 204 may be favorably made thinner. From this point of view, a thickness of the barrier film 204 may be in a range of 1 to 20 nm. Specifically, the thickness of the barrier film 204 may be in a range of 1 to 10 nm. In some embodiments, the barrier film 204 may be formed by an ionized PVD (Ionized Physical Vapor Deposition; iPVD), e.g., plasma sputtering. Alternatively, the barrier film 204 may be formed by other types of PVD such as conventional sputtering, ion plating or the like, CVD (Chemical Vapor Deposition) or ALD (Atomic Layer Deposition), or plasma-based CVD or ALD.

Subsequently, a ruthenium (Ru) liner film 205 is formed on the barrier film 204 by CVD (Operation S3; see FIG. 2C). In some embodiments, the Ru liner film 205 may have a thin thickness of e.g., 1 to 5 nm, to reduce resistance of the Cu wiring when increasing the volume of Cu to be buried in the trench or the hole.

In general, Ru has high wettability with Cu. As such, the Ru liner film 205 is formed as an underlayer of a Cu film in order to ensure good mobility of Cu when forming the Cu film by iPVD. This makes it hard to generate an overhang which blocks an opening of the trench 203 or the hole. Thus, Cu can be surely buried in a fine trench or hole without generating voids. In addition, since the Ru liner film 205 is formed by CVD, some impurities such as oxygen may be contained in the Ru liner film 205. Such impurities function to adsorb an alloy component contained in the Cu wiring as impurities, thus contributing to reduce the resistance of the Cu wiring.

In some embodiments, the Ru liner film 205 may be formed by a thermal CVD in which ruthenium carbonyl ($Ru_3(CO)_{12}$) is used as a film-forming material. This configuration allows the Ru liner film 205 having a high purity and thin thickness to be formed with high step coverage. Film-forming conditions applied at this time are as follows: an internal pressure of a processing vessel is in a range of 1.3 to 66.5 Pa and a film-forming temperature (wafer temperature) is in a range of 150 to 250 degrees C. In addition to the ruthenium carbonyl, the Ru liner film 205 may be formed of pentadienyl ruthenium compounds such as (cyclopentadienyl)(2,4-dimethylpentanienyl)ruthenium, bis(cyclopentadienyl)(2,4-methylpentadienyl)ruthenium, (2,4-dimethylpentadienyl) (ethylcyclopentadienyl)ruthenium, or bis(2,4-methylpentadienyl) (ethylcyclopentadienyl) ruthenium.

Subsequently, a Cu alloy film 206 consisting of a low purity Cu alloy is formed on the Ru liner film 205 by PVD to bury the trench 203 and the via (not shown) (Operation S4; see FIG. 2D). The formation of the Cu alloy film 206 may be performed by iPVD, e.g., plasma sputtering.

In the conventional PVD-based film-forming process, Cu ions are agglutinated so that an overhang that blocks the opening of the trench or the hole is prone to occur. To address this, it is required that a bias power to be applied to the wafer W is adjusted to control a film-forming action of the Cu ions and an etching action of plasma-generating gas ions (Ar ions) using iPVD, thus allowing the Cu ions to move. Thus, any trench or hole having a narrow opening may be favorably buried with the Cu ions. In some embodiments, in order to ensure mobility of the Cu ions and obtain good buriability thereof, a high temperature process (at a temperature ranging from 65 to 350 degrees C., especially, 230 to 300 degrees C.) in which the Cu ions are migrated, may be employed. Such a high temperature process enables Cu crystal grains to grow, thus reducing the resistance of the Cu wiring. In addition, as described above, the Ru liner film 205 having high wettability with Cu is formed under the Cu alloy film 206 such that the Cu ions flow without agglutination on the Ru liner film 205. This prevents the occurrence of an overhang even in a fine recess, which makes it possible to securely bury the recess with the Cu ions without generating voids.

Also, in this process, although a trench or hole having a small opening width is completely buried with the Cu alloy, one having a large opening width may be buried with the Cu alloy while allowing occurrence of more or less recesses.

In addition, in the formation of the Cu alloy film 206, the internal pressure (process pressure) of the processing vessel may be in a range of 1 to 100 mTorr (0.133 to 13.3 Pa), especially, a range of 35 to 90 mTorr (4.66 to 12.0 Pa).

Examples of the Cu alloy constituting the Cu alloy film 206 may include Cu—Mn, Cu—Al, Cu—Mg, Cu—Ag, Cu—Sn, Cu—Pb, Cu—Zn, Cu—Pt, Cu—Au, Cu—Ni, Cu—Co, Cu—Ti, or the like. Among these, Cu—Mn may be favorably used as the Cu alloy constituting the Cu alloy film 206.

The Cu alloy film 206 is formed using a target made of a desired Cu alloy. At this time, a relationship between an alloy composition of the target and a composition of the Cu alloy film 206 to be formed depends on film-forming conditions such as pressure. As such, the alloy composition of the target needs to be adjusted so that a desired alloy composition is obtained under actual manufacturing conditions. In some embodiments, a DC power which is applied to the target may be in a range of 4 to 12 kW, and in some embodiments, in a range of 6 to 10 kW.

After the Cu alloy film 206 is formed by burying the trench 203 and the via (or hole) with the Cu alloy, an overburdened layer 207 is formed on the Cu alloy film 206 in preparation for a subsequent planarization process (Operation S5; see FIG. 2E).

In some embodiments, the overburdened layer 207 may be formed by forming the same Cu alloy film as described above on the Cu alloy film 206 using PVD such as iPVD. Alternatively, the overburdened layer 207 may be formed by forming a pure Cu film on the Cu alloy film 206 using PVD or a plating process. However, from the viewpoint of achievement of good throughput and implementation of a simplified unit, the overburdened layer 207 may be formed by forming the same material as that of the Cu alloy film 206 using the same PVD (iPVD) equipment (or unit) used for the formation of the Cu alloy film 206. Since a burying property of the overburdened layer 207 does not need to be considered, in the PVD film-forming, the overburdened layer 207 may be favorably formed at a film-forming rate higher than that of the Cu alloy film 206.

Upon formation of the overburdened layer 207 in this way, an annealing process is performed to stabilize the Cu alloy film 206, if necessary (Operation S6; see FIG. 2F).

Thereafter, the entire surface of the wafer W is polished by Chemical Mechanical Polishing (CMP) to remove the overburdened layer 207, the Cu alloy film 206, the Ru liner film 205 and the barrier film 204, thus planarizing the surface of the wafer W (Operation S7; see FIG. 2G). Thus, a Cu wiring 208 is formed in the trench and the via (or hole).

Subsequently, a dielectric cap layer (dielectric film) 209 made of a dielectric material, e.g., SiCN, is formed on the surface of the wafer W including the Cu wiring 208, which is formed by CMP as described above (Operation S8; see FIG. 2H). In some embodiments, the dielectric film 209 may be formed by CVD.

Upon formation of the dielectric cap layer 209, alloy components (e.g., Mn) contained in the Cu wiring 208 are segregated on a region facing the dielectric cap layer 209 in the Cu wiring 208 so that a segregation layer 208a is formed, as shown in FIG. 3. The segregation layer 208a enhances adhesion between the Cu wiring 208 and the dielectric cap layer 209. Specifically, a small amount of oxygen as impurities is present in the dielectric cap layer 209. In addition, the alloy components contained in the Cu wiring 208 are diffused toward the impurities present in the dielectric cap layer 209 by heat generated upon the film-forming process. Thus, the segregation layer 208a is formed. Further, the dielectric cap layer 209 and the alloy components contained in the segregation layer 208a are coupled to each other, thereby improving the adhesion therebetween. This improves an electro-migration resistance of the Cu wiring 208.

Meanwhile, an excessive amount of alloy components (e.g., Mn) which is larger than an amount required to form the segregation layer 208a may be contained in the Cu alloy film 206. The excessive amount of alloy components is diffused toward some impurities such as oxygen present in the Ru liner film 205 by heat generated upon the annealing process or heat generated when forming the dielectric cap layer 209 so that they are caught on the impurities (see FIG. 3). Thus, there is little alloy component in the Cu wiring 208, which makes it possible to suppress resistance of the Cu wiring 208 from being increased by the alloy components.

As described above, according to this embodiment, when the Cu wiring 208 is formed by the alloy components contained in the Cu alloy film 206, followed by the formation of the dielectric cap layer 209 thereon, the alloy components are segregated on the interface between the Cu wiring 208 and the dielectric cap layer 209. This enhances the adhesion between the Cu wiring 208 and the dielectric cap layer 209, thus improving the electro-migration resistance of the Cu wiring 208. In addition, alloy components remaining as impurities in the Cu alloy film 206 are diffused toward the small amount of impurities such as oxygen present in the CVD-based Ru liner film 205 by heat generated until the dielectric cap layer 209 is formed so that they are caught on the impurities. In addition, the PVD process may essentially cause few impurities and increase an amount of Cu crystal grains by heat generated upon the PVD-based film-forming process. This reduces the resistance of the Cu wiring 208. Further, the Ru liner film 205 having high wettability with Cu is formed, and subsequently, the Cu alloy film 206 is formed by PVD to bury the trench and the via. This makes it possible to obtain a good burying property without generating voids which result from the Cu plating.

Further, among a sequence of operations as described above, Operation S2 of forming the barrier film 204, Operation S3 of forming the Ru liner film 205, Operation S4 of forming the Cu alloy film 206, and Operation S5 of forming the overburdened layer 207 may be consecutively performed without being exposed to atmosphere while maintaining a vacuum state. In some embodiments, the exposure to atmosphere may be applied between any two adjacent operations of them.

<Film-Forming System>

Next, a film-forming system for implementing the Cu wiring forming method according to the above embodiment of the present disclosure will be described. FIG. 4 is a plane view showing an example of a multi-chamber type film-forming system 1 for implementing the Cu wiring forming method according to the above embodiment of the present disclosure.

The film-forming system 1 includes a first processing section 2 configured to form the barrier film 204 and the Ru liner film 205, a second processing section 3 configured to form a pure Cu film and the Cu alloy film 206, and a loading/unloading section 4. The film-forming system 1 is used to form the Cu wiring 208 on the wafer W and perform the sequence of operations until the overburdened layer 207 is formed as described in the above embodiment.

The first processing section 2 includes a first vacuum transfer chamber 11 having a heptagon shape when viewed from the top, two barrier film-forming units 12a and 12b, and two Ru liner film-forming units 14a and 14b, which are coupled to walls of four sides of the first vacuum transfer chamber 11. The barrier film-forming unit 12a and the Ru liner film-forming unit 14a, and the barrier film-forming unit 12b and the Ru liner film-forming unit 14b, are arranged symmetric with respect to a line.

Degasing chambers 5a and 5b are coupled to two other walls of the sides of the first vacuum transfer chamber 11 to degas the wafer W. A buffer chamber 5 is coupled to the remaining wall of the sides of the first vacuum transfer chamber 11 and is located between the degasing chambers 5a and 5b coupled to the first vacuum transfer chamber 11. Through the buffer chamber 5, the wafer W is transferred between the first vacuum transfer chamber 11 and a second vacuum transfer chamber 21 (which will be described later).

The barrier film-forming units 12a and 12b, the Ru liner film-forming units 14a and 14b, the degasing chambers 5a and 5b, and the buffer chamber 5 are coupled to the respective sides of the first vacuum transfer chamber 11 through respective gate valves G. These units communicate with and are isolated from the first vacuum transfer chamber 11 by opening and closing the respective gate valves G.

The first vacuum transfer chamber 11 is maintained at a predetermined vacuum atmosphere. The first vacuum transfer chamber 11 includes a first transfer mechanism 16 which is configured to perform loading and unloading of the wafer W into and out of the barrier film-forming units 12a and 12b, the Ru liner film-forming units 14a and 14b, the degasing chambers 5a and 5b, and the buffer chamber 5. The first transfer mechanism 16 is arranged at substantially the center of the first vacuum transfer chamber 11. The first transfer mechanism 16 includes a rotatable/extendible part 17 and two support arms 18a and 18b which are mounted oppositely in a leading end of the rotatable/extendible part 17 and configured to hold the wafer W.

The second processing section 3 includes the second vacuum transfer chamber 21 having an octagonal shape when viewed from the top, two Cu alloy film-forming units 22a and 22b configured to form the Cu alloy film 206, and two Cu film-forming units 24a and 24b configured to form the pure Cu film or the Cu alloy film 206. The Cu alloy film-forming units 22a and 22b are coupled to walls of two opposite sides of the second vacuum transfer chamber 21.

The degasing chambers 5a and 5b are respectively coupled to walls of two sides facing the first processing section 2 in the second vacuum transfer chamber 21. The buffer chamber 5 is connected to a wall of a side positioned between the degasing chambers 5a and 5b in the second vacuum transfer chamber 21. That is, the buffer chamber 5 and the degasing chambers 5a and 5b are mounted between the first vacuum transfer chamber 11 and the second vacuum transfer chamber 21 with the degasing chambers 5a and 5b arranged in opposite sides of the buffer chamber 5. A load lock chamber 6 is coupled to a side facing the loading/unloading section 4 in the second vacuum transfer chamber 21. The load lock chamber 6 is configured to transfer the wafer W therethrough in both air and vacuum states.

The Cu alloy film-forming units 22a and 22b, the Cu film-forming units 24a and 24b, the degasing chambers 5a and 5b, and the load lock chamber 6 are coupled to the respective sides of the second vacuum transfer chamber 21 via respective gate valves G. These units communicate with and are isolated from the second vacuum transfer chamber 21 by closing the respective gate valves G. In addition, the buffer chamber 5 is directly connected to the second vacuum transfer chamber 21 without using a gate valve.

The second vacuum transfer chamber 21 is maintained at a predetermined vacuum atmosphere. The second vacuum transfer chamber 21 includes a second transfer mechanism 26 which is configured to perform loading and unloading of the wafer W into and out of the Cu alloy film-forming units 22a and 22b, the Cu film-forming units 24a and 24b, the degasing chambers 5a and 5b, and the load lock chamber 6. The second transfer mechanism 26 is arranged at substantially the center of the second vacuum transfer chamber 21. The second transfer mechanism 26 includes a rotatable/extendible part 27, and two support arms 28a and 28b which are mounted oppositely in a leading end of the rotatable/extendible part 27 and configured to hold the wafer W.

The loading/unloading section 4 is located opposite the second processing section 3 with the load lock chamber 6 interposed between the second processing section 3 and the loading/unloading section 4. The loading/unloading section 4 includes an atmosphere transfer chamber 31 to which the load lock chamber 6 is coupled. A gate valve G is mounted between the load lock chamber 6 and the atmosphere transfer chamber 31. Two connection ports 32 and 33 are formed in a wall of a side opposite to a side facing the load lock chamber 6 in the atmosphere transfer chamber 31. Carriers C in which the wafers W as substrates to be processed are received, are connected to the connection ports 32 and 33. Shutters (not shown) are mounted in the respective connection ports 32 and 33 to which a carrier C having wafers W stacked therein or an empty carrier C is directly mounted. In this arrangement, removal of the shutters allows the carriers C to communicate with the atmosphere transfer chamber 31 through the connection ports 32 and 33 while preventing introduction of external air into the atmosphere transfer chamber 31. An alignment chamber 34 is mounted to a side of the atmosphere transfer chamber 31 to align the wafer W. The atmosphere transfer chamber 31 includes a third transfer mechanism 36 which is configured to perform loading/unloading of the wafer W into/out of the carriers C or the load lock chamber 6 under an atmospheric state. The third transfer mechanism 36 includes two multi joint arms and is configured to move along a rail 38 according to an arrangement direction of the carriers C. The wafer W is placed on a hand 37 provided in leading ends of the multi joint arms such that the wafer W is transferred.

The film-forming system 1 includes a control unit 40. The control unit 40 includes a process controller 41 including a microprocessor (computer) which executes a control action on the respective units, a user interface 42 such as a keyboard through which an operator performs a command input operation or other operations to manage the film-forming system 1, a display which visually displays an operation status of the film-forming system 1, and a memory 43 in which a control program for implementing processes executed by the film-forming system 1 under the control of the process controller 41 or a program for executing processes on respective parts of the processing units according to a variety of data and process conditions, i.e. a recipe, is stored. The user interface 42 and the memory 43 are connected to the process controller 41.

The recipe is stored in a memory medium 43a of the memory 43. The memory medium 43a may include a hard disk or a portable memory medium such as a CD-ROM, a DVD, a flash memory or the like. In some embodiments, the recipe may be properly transmitted from other devices via, e.g., a dedicated line.

Further, if needed, in response to instructions sent from the user interface 42, an arbitrary recipe may be called out from the memory 43 and may be executed by the process controller 41. Thus, desired processes of the film-forming system 1 are performed under the control of the process controller 41.

In the film-forming system 1 configured as above, the wafer W having a predetermined pattern in which a trench or hole is formed, is taken out of the carrier C by the third transfer mechanism 36 and subsequently, is transferred to the load lock chamber 6. The load lock chamber 6 is decompressed to the same vacuum degree as that of the second vacuum transfer chamber 21. Subsequently, the wafer W received in the load lock chamber 6 is held by the second transfer mechanism 26 of the second vacuum transfer chamber 21 and subsequently, is transferred to the degasing chamber 5a (or 5b) where the wafer W is subjected to the degasing process. Subsequently, the wafer W received in the degasing chamber 5a (or 5b) is held by the first transfer mechanism 16 of the first vacuum transfer chamber 11, followed by being loaded into the barrier film-forming unit 12a (or 12b). In the barrier film-forming unit 12a (or 12b), the barrier film 204 is formed as described above. Upon formation of the barrier film 204, the wafer W received in the barrier film-forming unit 12a (or 12b) is held by the first transfer mechanism 16 and subsequently, is transferred to the Ru liner film-forming unit 14a (or 14b) where the Ru liner film 205 is formed as described above. Thereafter, the wafer W received in the Ru liner film-forming unit 14a (or 14b) is held by the first transfer mechanism 16, followed by being transferred to the buffer chamber 5. Subsequently, the wafer W is held by the second transfer mechanism 26 of the second vacuum transfer chamber 21 and then, is transferred to the Cu alloy film-forming unit 22a (or 22b) where the Cu alloy film 206 is formed as described above. Thereafter, the overburdened layer 207 is formed on the Cu alloy film 206. In some embodiments, as described above, the overburdened layer 207 may be formed by continuously forming the Cu alloy film 206 inside the Cu alloy film-forming unit 22a (or 22b) in situ. Alternatively, the overburdened layer 207 may be formed by, using the second transfer mechanism 26, picking up the wafer W received in the Cu alloy film-forming unit 22a (or 22b), loading the picked-up wafer W into the Cu alloy film-forming unit 24a (or 24b), and forming an additional pure Cu film or an additional Cu alloy film on the Cu alloy film 206.

Upon formation of the overburdened layer 207, the wafer W is loaded into the load lock chamber 6 by the second transfer mechanism 26. At this time, an internal pressure of the load lock chamber 6 is recovered to atmospheric pressure. Thereafter, the wafer W having the Cu film formed therein is held by the third transfer mechanism 36 and is transferred to the carrier C. The sequence of operations as described above is repeated by the number of the wafers W received in the carrier C.

With the film-forming system 1, the barrier film 204, the Ru liner film 205, the Cu alloy film 206 and the overburdened layer 207 are formed at the vacuum state without being exposed to air. This prevents oxidation from being generated at interfaces between the respective films, thus obtaining a high-performance Cu wiring.

In addition, in the case where the overburdened layer 207 is formed by the Cu plating, the wafer W is unloaded from the film-forming system 1 after the formation of the Cu alloy film 206.

<Cu Film-Forming Unit>

Next, an example of the Cu alloy film-forming unit 22a (or 22b) which forms the Cu alloy film 206 will be described.

Figure 5:
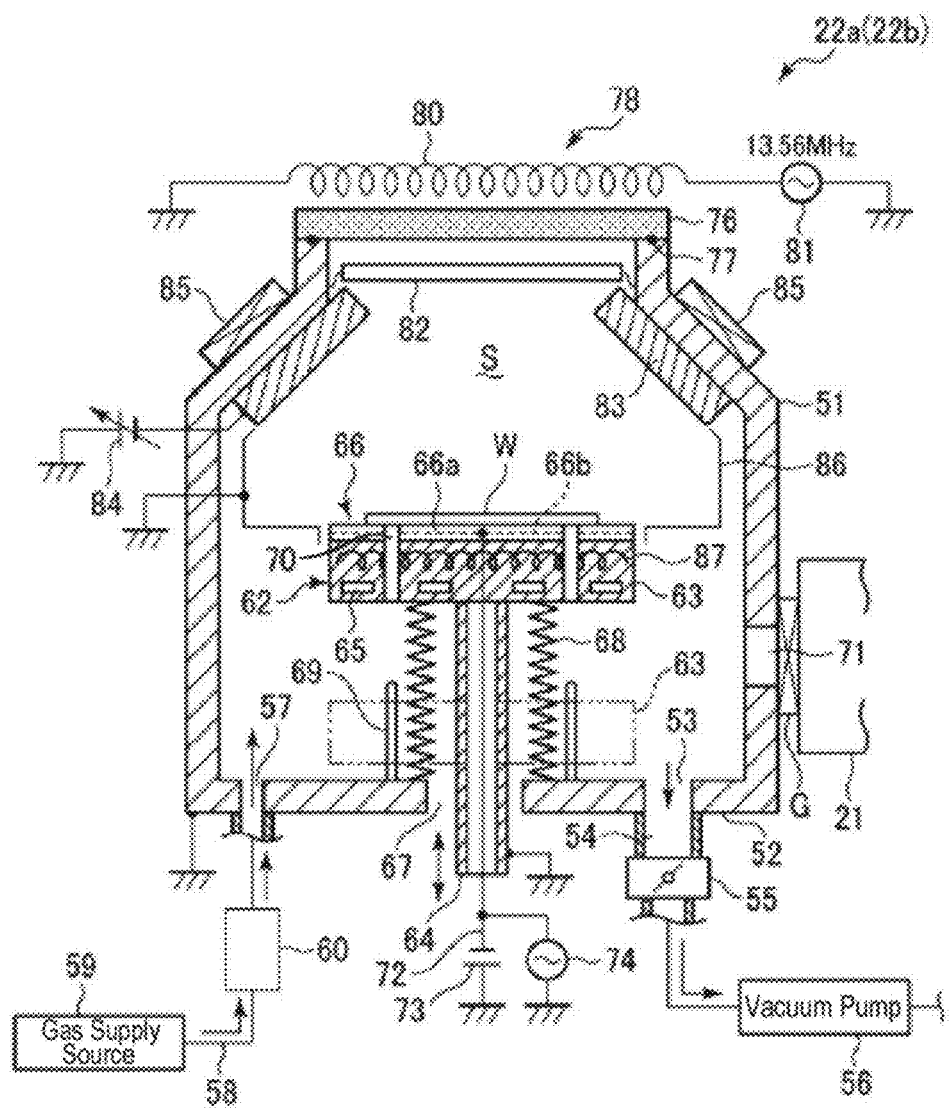
FIG. 5 is a cross-sectional view showing a Cu alloy film-forming unit configured to form a Cu alloy film, which is mounted in the film-forming system in FIG. 4.

FIG. 5 is a cross-sectional view showing an example of the Cu alloy film-forming unit 22a (or 22b). An ICP (Inductively Coupled Plasma) type plasma sputtering equipment that is an iPVD is employed as an example of a Cu alloy film-forming unit 22a (or 22b).

As shown in FIG. 5, the Cu alloy film-forming unit 22a (or 22b) includes a barrel type processing vessel 51 formed of e.g. aluminum. The processing vessel 51 is grounded to the earth and is provided with an exhaust port 53 in the bottom 52 thereof. The exhaust port 53 is connected to an exhaust pipe 54. A throttle valve 55 and a vacuum pump 56 are mounted in the exhaust pipe 54 such that the processing vessel 51 can be vacuumed through the exhaust pipe 54. In addition, a gas inlet port 57 is formed in the bottom 52 of the processing vessel 51 such that gas is introduced into the processing vessel 51. A gas supply pipe 58 is connected to the gas inlet port 57. A gas supply source 59 configured to supply a noble gas as a plasma-exciting gas (e.g., Ar gas) or other required gas (e.g. $N_2$ gas), is connected to the gas supply pipe 58. In addition, a gas control unit 60 including a flow rate controller, a valve and the like is mounted in the gas supply pipe 58.

The processing vessel 51 includes a mounting mechanism 62 which mounts the wafer W as a substrate to be processed thereon. The mounting mechanism 62 includes a disk-type mounting table 63, and a hollow barrel type column 64 which supports the mounting table 63 while being grounded to the earth. The mounting table 63 is formed of a conductive material such as an aluminum alloy, and is grounded to the earth via the column 64. The mounting table 63 includes a cooling jacket 65 mounted therein through which a cooling medium is supplied via a cooling medium passageway (not shown) formed therein. In addition, the mounting table 63 includes a built-in resistance heater 87 which is clad with an insulating material. The resistance heater 87 is supplied with electric power from a power supply (not shown). The mounting table 63 is provided with a thermocouple (not shown). With this configuration, the wafer W is controlled to have a predetermined temperature by controlling the supply of the cooling medium to the cooling jacket 65 and the supply of electric power to the resistance heater 87 based on a temperature detected at the thermocouple.

A thin disk-type electrostatic chuck 66 is mounted on the mounting table 63. The electrostatic chuck 66 is equipped with a dielectric member 66a such as alumina, and an electrode 66b embedded in the dielectric member 66a. With this configuration, the electrostatic chuck 66 attracts and holds the wafer W by virtue of electrostatic force. A lower portion of the column 64 extends downwards through a through hole 67 formed at the center of the bottom 52 of the processing vessel 51. The column 64 is vertically movable by an elevator (not shown) so that the entire mounting mechanism 62 can be moved up and down.

Metal bellows 68 which has a corrugated shape and is extensible/compressible, is mounted to surround the column 64. An upper portion of the metal bellows 68 is hermetically attached to a lower surface of the mounting table 63, and a lower portion thereof is hermetically attached to an upper surface of the bottom 52 of the processing vessel 51. This configuration allows the mounting mechanism 62 to be moved up and down while maintaining airtightness in the processing vessel 51.

For example, three support pins 69 are vertically installed on the bottom 52. For the sake of simplicity, only two support pins 69 are shown in FIG. 5. Pin holes 70 are formed in the mounting table 63 to correspond to the support pins 69. When the mounting table 63 is moved down, upper portions of the support pins 69 penetrate into the respective pin holes 70 to support and hold the wafer W. Thus, the wafer W can be transferred to a transfer arm (not shown) which enters into the processing vessel 51 from the outside. To do this, an entrance 71 through which the transfer arm is moved, is formed in a lower sidewall of the processing vessel 51. An openable/closable gate valve G is mounted in the entrance 71. The second vacuum transfer chamber 21 is connected to the entrance 71 through the gate valve G.

The electrode 66b of the electrostatic check 66 is connected to a power supply 73 via a power supply line 72. The electrode 66b is supplied with a DC voltage from the power supply 73 so that the wafer W is attracted and held on the electrostatic chuck 66 by virtue of electrostatic force. In addition, a high-frequency power supply for bias 74 is connected to the power supply line 72 through which a high-frequency bias voltage is supplied to the electrode 66b. Thus, the bias voltage is applied to the wafer W. A frequency of the high-frequency bias voltage may be in a range of 400 kHz to 60 MHz. In this embodiment, a frequency of 13.56 MHz is used.

A high-frequency transmission plate 76 formed of a dielectric such as alumina is hermetically mounted on a top portion of the processing vessel 51 through a seal member 77 such as an O-ring. In addition, a plasma generator 78 is mounted above the high-frequency transmission plate 76. The plasma generator 78 is configured to convert a noble gas (e.g., Ar gas) as a plasma-exciting gas to plasma, and supply the plasma into a processing space S defined inside the processing vessel 51. Instead of the Ar gas, He, Ne, Kr or the like may be used as the plasma-exciting gas.

The plasma generator 78 includes an induction coil 80 which is arranged to face the high-frequency transmission plate 76. The induction coil 80 is connected to a high-frequency power supply 81 which generates a plasma-generating frequency of 13.56 MHz. With this configuration, a high-frequency power is supplied into the processing space S through the high-frequency transmission plate 76, thus producing an induced electric field.

In addition, a baffle plate 82 formed of e.g. aluminum, is mounted underneath the high-frequency transmission plate 76 to diffuse the supplied high-frequency power. Under the baffle plate 82, a target 83 made of Cu alloy is provided to surround an upper portion of the processing space S in the processing vessel 51 while being attached to an internal wall of the processing vessel 51. The target 83 has an annular shape (e.g. truncated conical shell) whose cross-section is inclined inwardly as it goes upwards. The target 83 is connected to a variable-voltage DC power supply 84 configured to supply a DC voltage for attracting Ar ions. Alternatively, an AC power supply may be used instead of the DC power supply 84. The target 83 is formed of the same material (i.e., Cu alloy) as that of the Cu alloy film 206.

Further, a magnet 85 is mounted to face an outer circumference of the target 83 with the processing vessel 51 interposed between the magnet 85 and the target 83 such that a magnetic field induced from the magnet 85 is applied to the target 83. The Ar ions contained in the plasma causes the target 83 to be sputtered into Cu metal atoms or metal atomic groups. Further, the target 83 is mostly ionized when it passes through the plasma.

A cylindrical protection cover member 86 formed of e.g. aluminum or copper, is installed below the target 83 to surround the processing space S. The protection cover member 86 is grounded to the earth. A lower portion of the protection cover member 86 is bent inwardly such that an end portion thereof is located adjacent to the side of the mounting table 63. Thus, an inner end of the bent end portion of the protection cover member 86 is arranged to surround an outer periphery of the mounting table 63.

Further, the respective units of the Cu alloy film-forming unit 22a (or 22b) are controlled by the control unit 40.

In the Cu alloy film-forming unit 22a (or 22b) configured as above, the wafer W is loaded into the processing vessel 51 shown in FIG. 5 and is mounted on the mounting table 63 of the mounting mechanism 62 so that the wafer W is attracted and held by the electrostatic chuck 66. Subsequent operations are performed under the control of the control unit 40. In this case, a temperature of the mounting table 63 is controlled by controlling the supply of the cooling medium to the cooling jacket 65 and the supply of the electric power to the resistance heater 87 based on the temperature detected at the thermocouple (not shown).

In a state where the processing vessel 51 is being maintained at a predetermined vacuum state by the operation of the vacuum pump 56, the Ar gas is flown into the processing vessel 51 at a predetermined flow rate under the control of the gas control unit 60. Simultaneously, the throttle valve 55 is operated such that the processing vessel 51 is vacuumed to a predetermined degree of vacuum. Thereafter, the target 83 is supplied with the DC voltage from the DC power supply 84. Further, the induction coil 80 is supplied with high-frequency power (plasma power) from the plasma generator 78. Further, the electrode 66b of the electrostatic chuck 66 is supplied with a predetermined level of the high-frequency bias voltage from the high-frequency power supply for bias 74.

As a result, Ar plasmas are formed inside the processing vessel 51 by the high-frequency power supplied to the induction coil 80, thus producing the Ar ions. The Ar ions are attracted toward the target 83 by virtue of the DC voltage applied to the target 83 and collide with the target 83. Then, the target 83 is sputtered to emit Cu crystal grains. At this time, an amount of the Cu crystal grains emitted by virtue of the DC voltage applied to the target 83 is optimally controlled.

The Cu crystal grains sputtered from the target 83 are mostly ionized while they pass through the plasma. In this case, the Cu crystal grains are scattered downwards in a state in which ionized atoms and electrically neutral atoms are mixed. In some embodiments, the internal pressure of the processing vessel 51 is raised to a certain level such that a density of the plasma is increased, thereby ionizing the Cu crystal grains at a high efficiency rate. The ionization is controlled by the high-frequency power supplied from the high-frequency power supply 81.

When the ionized Cu crystal grains are introduced into an ion sheath region that is formed in a thickness of about a few mm on the wafer W by virtue of the high-frequency bias power applied to the electrode 66b of the electrostatic chuck 66 from the high-frequency power supply for bias 74, they are accelerated and attracted to the wafer W with strong directivity. Thus, the ionized Cu crystal grains are deposited on the wafer W, thereby forming the Cu alloy film 206.

At this time, a temperature of the wafer W is set to be high (in a range of 65 to 350 degrees C., and in some embodiments 230 to 300 degrees C.), and the bias power applied to the electrode 66b of the electrostatic chuck 66 from the high frequency power supply for bias 74 is adjusted. With this, operation of forming a Cu alloy film and an Ar-based etching are adjusted so that a mobility of the Cu alloy is improved. As a result, a trench or hole having a narrow opening can be favorably buried with the Cu alloy. Specifically, on the assumption that a deposition rate of the Cu alloy film is $T_D$ and an etching rate of the plasma-generating gas ions is $T_E$, the bias power may be adjusted such that a relationship of $0 \leq T_E/T_D < 1$, and in some embodiments $0 < T_E/T_D < 1$ is satisfied.

In some embodiments, in order to obtain a good burying property, the internal pressure (processing pressure) of the processing vessel 51 may be in a range of 1 to 100 mTorr (0.133 to 13.3 Pa), and in some embodiments 35 to 90 mTorr (4.66 to 12.0 Pa). Further, the DC voltage applied to the target 83 may be in a range of 4 to 12 kW, and in some embodiments 6 to 10 kW.

In some embodiments, for a trench or hole having a wide opening, iPVD may be used as the film-forming method, but is not limited thereto. Alternatively, the conventional PVD such as sputtering or ion plating may be used as the film-forming method.

<Cu Film-Forming Unit>

The Cu alloy film-forming unit 24a (or 24b) may have basically the same configuration as the Cu alloy film-forming unit 22a (or 22b) shown in FIG. 5. In the Cu alloy film-forming unit 24a (or 24b), a pure Cu is used as the target 83. In a case where the burying property does not need to be considered, iPVD has been described to be used as the film-forming method, but is not limited thereto. In some embodiments, the conventional PVD such as sputtering or ion plating may be used as the film-forming method.

<Barrier Film-Forming Unit>

The barrier film-forming unit 12a (or 12b) is configured to form the barrier film 204 using a plasma sputtering, and may have the same configuration as that of the Cu alloy film-forming unit 22a (or 22b) shown in FIG. 5 except that a material of the target 83 is changed. In the above embodiment, the plasma sputtering has been described to be used as the film-forming method, but is not limited thereto. In some embodiments, a conventional PVD such as sputtering or ion plating, CVD or ALD (Atomic Layer Deposition), or plasma-based CVD or ALD may be used as the film-forming method. In view of reduction of impurities, PVD may be effectively employed.

<Ru Liner Film-Forming Unit>

Figure 6:
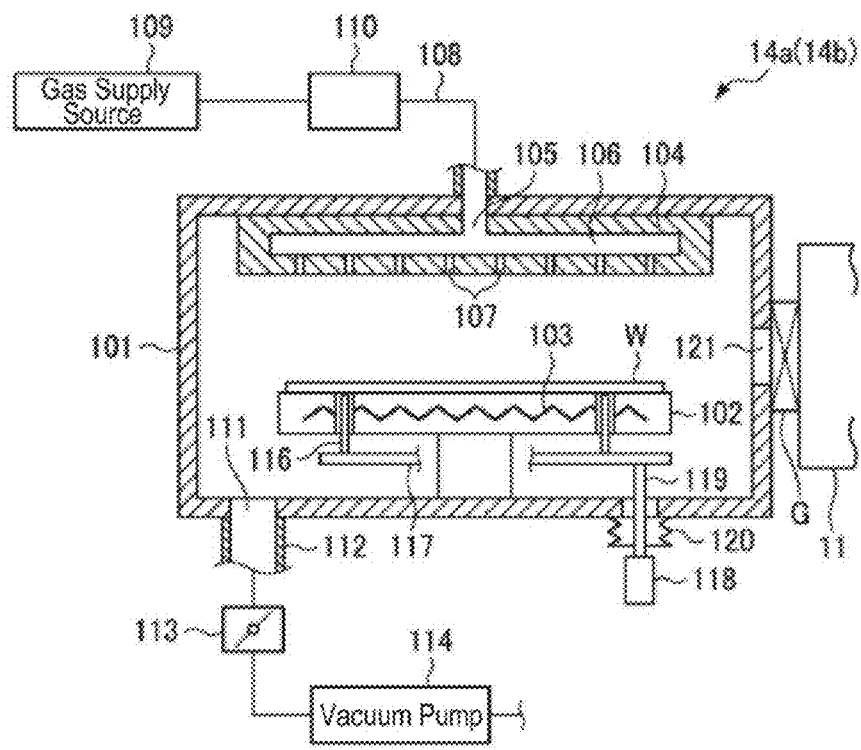
FIG. 6 is a cross-sectional view showing a Ru liner film-forming unit configured to form a Ru liner film, which is mounted in the film-forming system in FIG. 4.

Next, a description will be directed to the Ru liner film-forming unit 14a (or 14b) which forms the Ru liner film 205. As described above, the Ru liner film 205 may be formed by thermal CVD. FIG. 6 is a cross-sectional view showing an example of the Ru liner film-forming unit 14a (or 14b) which forms the Ru liner film 205 using the thermal CVD.

As shown in FIG. 6, the Ru liner film-forming unit 14a (or 14b) includes a barrel type processing vessel 101 formed of e.g., aluminum. The processing vessel 101 includes a mounting table 102 formed of e.g. ceramics such as MN, which mounts the wafer W thereon. The mounting table 102 includes a heater 103 embedded therein. The heater 103 generates heat by an electric power supplied from a heater power supply (not shown).

A shower head 104 is provided opposite the mounting table 102 on a ceiling of the processing vessel 101. Through the shower head 104, a processing gas or a purge gas for formation of the Ru liner film 205 is introduced into the processing vessel 101. The shower head 104 includes a gas inlet port 105 formed at an upper portion thereof, and a gas diffusion space 106 formed therein. A plurality of gas discharge holes 107 is formed in a bottom surface of the shower head 104. A gas supply pipe 108 is connected to the gas inlet port 105. The gas supply pipe 108 is connected to a gas supply source 109 which is configured to supply the processing gas or the purge gas for formation of the Ru liner film 205. In addition, a gas control unit 110 equipped with a flow rate controller, a valve and the like, is mounted in the gas supply pipe 108. Examples of a material of the Ru liner film 205 may include ruthenium carbonyl [$Ru_3(CO)_{12}$] as described above. The ruthenium carbonyl is thermally decomposed into Ru so that the Ru liner film 205 can be formed on the wafer W.

An exhaust port 111 is formed in the bottom surface of the processing vessel 101. The exhaust port 111 is connected to an exhaust pipe 112. The exhaust pipe 112 is connected to a throttle valve 113 and a vacuum pump 114, which are configured to control an internal pressure of the processing vessel 101. Thus, the processing vessel 101 is vacuumed.

Three wafer support pins 116 (only two pins are shown in FIG. 6) for transferring the wafer W are mounted in the mounting table 102 such that they come in and out of the surface of the mounting table 102 while being fixed to a support plate 117. The wafer support pins 116 are vertically moved through the support plate 117 by vertically moving a rod 119 using a drive mechanism 118 such as an air cylinder. Reference numeral 120 denotes a bellows. A wafer entrance 121 is formed in a sidewall of the processing vessel 101. Through the wafer entrance 121, the wafer W is transferred between the processing vessel 101 and the first vacuum transfer chamber 11 with the gate valve G opened.

In the Ru liner film-forming unit 14a (or 14b) configured as above, upon opening of the gate valve G, the wafer W is loaded into the processing vessel 101 and is mounted on the mounting table 102 through the opened gate valve G. Subsequently, upon closing of the gate valve G, the processing vessel 101 is evacuated by the operation of the vacuum pump 114 such that the processing vessel 101 is maintained at a predetermined level of pressure. Further, the wafer W mounted on the mounting table 102 is heated to a predetermined temperature by the heater 103. Under this situation, the processing gas such as ruthenium carbonyl [$Ru_3(CO)_{12}$] is introduced into the processing vessel 101 from the gas supply source 109 through the gas supply pipe 108 and the shower head 104. Then, the processing gas reacts with the surface of the wafer W, thus forming the Ru liner film 205 on the wafer W.

In addition to the ruthenium carbonyl, pentadienyl ruthenium compounds may be used as the material of the Ru liner film 205, together with decomposition gas such as $O_2$ gas.

<Other Units>

In the above embodiment, the sequence of operations until the overburdened layer 207 is formed has been described to be performed by the film-forming system 1 configured as above, but is not limited thereto. In some embodiments, a series of processes including the annealing process, the CMP process and the forming process of the dielectric cap layer 209 which are to be performed on the wafer W (that is unloaded from the film-forming system 1) may be performed by additional units such as an annealing unit, a CMP unit, and a dielectric cap layer forming unit, respectively. These additional units may have a conventional configuration. In some embodiments, by constituting a Cu wiring forming system with both the additional units and the film-forming system 1 and controlling the entire operation of the Cu wiring forming system using a common control unit having the same function as the control unit 40, the film-forming method according to the above embodiment may be collectively controlled based on a single recipe.

EXPERIMENTAL EXAMPLES

Next, various experimental examples will be described.

First Experimental Example

Figure 7:
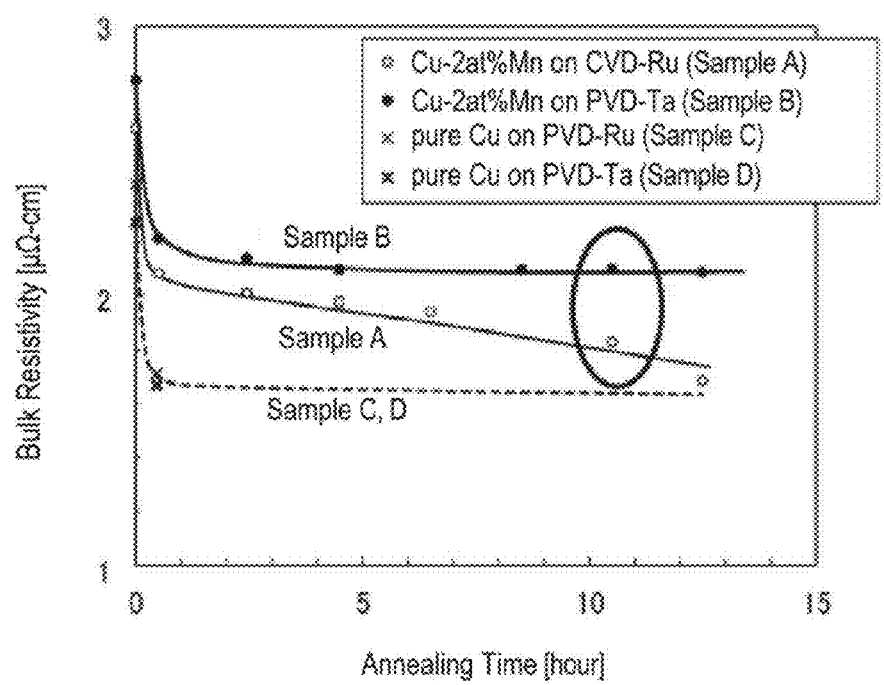
FIG. 7 is a view showing a relationship between an annealing time and a bulk resistivity in Samples each of which is obtained by forming a CuMn alloy film on a CVD-based Ru film by PVD; and by forming a CuMn alloy film on a PVD-based Ta film by PVD, as compared with Samples obtained by forming a pure Cu film.
Figure 8:
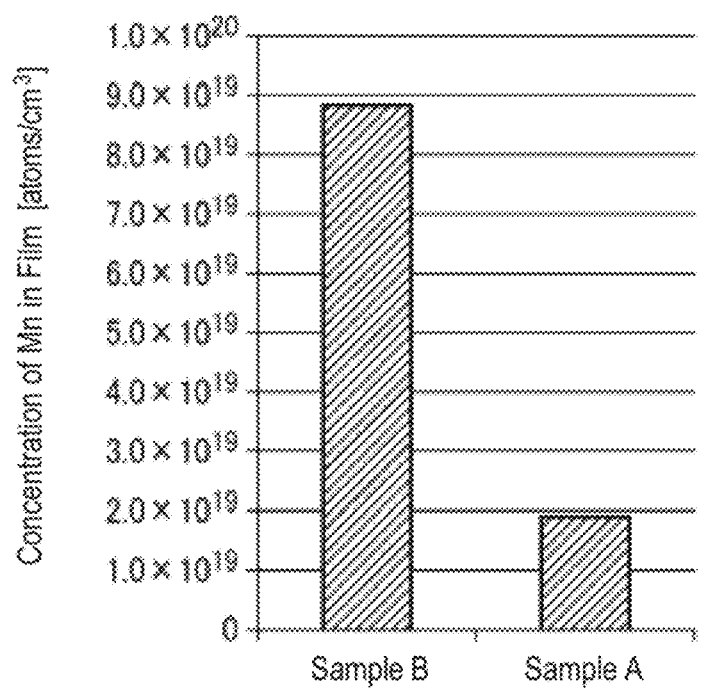
FIG. 8 is a view showing a concentration of Mn contained in a CuMn alloy film which is obtained by performing an annealing process on Samples obtained by forming the CuMn alloy film on a CVD-based Ru film and a PVD-based Ta film by PVD, respectively.

The following is a description of a first experimental example where Samples A and B were prepared. Sample A was obtained by forming a PVD-based TaN film and a CVD-based Ru film on a substrate, followed by forming an alloy film of Cu-2 at % Mn (i.e., Cu alloy containing 25 Mn atoms) film using PVD. Sample B was obtained by forming a PVD-based TaN film and a PVD-based Ta film on the substrate, followed by forming an alloy film of Cu-2 at % Mn using PVD. These Samples A and B were subjected to an annealing process at 400 degrees C. while changing an annealing time up to 12.5 hours, and then, a bulk resistivity was measured. For comparison, Samples C and D were prepared. Similarly, Sample C was obtained by forming a PVD-based TaN film and a CVD-based Ru film on the substrate, followed by forming a pure Cu film thereon using PVD. Sample D was obtained by forming a PVD-based TaN film and a PVD-based Ta film on the substrate, followed by forming a pure Cu film thereon using PVD. These Samples C and D were subjected to the annealing process at 400 degrees C. for 0.5 hours, and then, a bulk resistivity was measured. In addition, all Samples A to D were experimented with blanket films formed. The results are shown in FIG. 7. Further, after the annealing process for 10.5 hours, a concentration of Mn contained in the CuMn alloy film (hereinafter sometimes simply referred to as "Cu alloy film") in each of Samples A and B were measured using a secondary ion mass spectroscopy (SIMS). The measurement results are shown in FIG. 8.

As shown in FIG. 7, the first experimental example has shown that Sample B in which the Cu alloy film is formed on the PVD-based Ta film using PVD has a stabilized high-resistivity even though the annealing time increases, whereas Sample A in which the Cu alloy film is formed on the CVD-based Ru film using PVD has a decreased resistivity as the annealing time increases. Thus, it was found that when the annealing time is 12.5 hours, Sample A has a resistivity approximately equal to that of the pure Cu film. In addition, as shown in FIG. 8, the experimental example has shown that the concentration of Mn contained in the Cu alloy film in Sample A is decreased by the annealing as compared with that in Sample B. In this regard, it can be seen that the CVD-based Ru film is formed as an underlayer of the Cu alloy film so that the concentration of Mn contained in the Cu alloy film is decreased, thus reducing the resistance of the Cu alloy film.

Second Experimental Example

Figure 9:
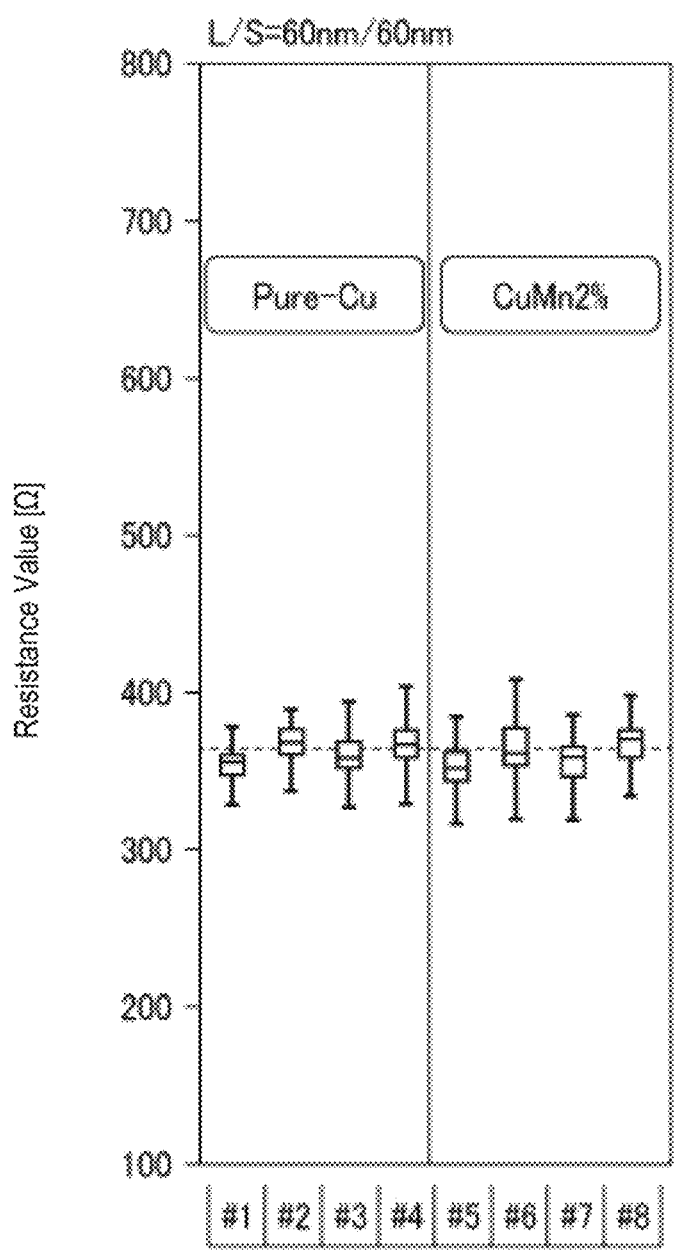
FIG. 9 is a view showing measurement results of line resistances of Samples each of which is prepared to have a Cu wiring obtained by forming a pure Cu film on a CVD-based Ru liner film by PVD; and by forming a CuMn alloy film on a CVD-based Ru liner film by PVD.

The following is a description of a second experimental example where Samples #1 to #8 were prepared. A wafer in this experimental example includes an interlayer dielectric film having a line-and-space pattern (L/S=60 nm/60 nm) formed therein. Each of Samples #1 to #4 was obtained by forming a PVD-based TaN barrier film and a CVD-based Ru liner film on the wafer, followed by forming a PVD-based pure Cu film using a pure Cu target to bury a trench. Each of Samples #5 to #8 was obtained by forming an alloy film of Cu-2 at % Mn (hereinafter sometimes simply referred to as "Cu alloy film") on the wafer by PVD using a Cu—Mn alloy target to bury a trench. These Samples #1 to #8 were subjected to the annealing process at 100 degrees C. for 30 minutes, followed by a CMP process, followed by formation of a CVD-based dielectric (SiCN) cap layer. Thus, a Cu wiring was formed. Thereafter, a resistance value of the Cu wiring was measured. The results are shown in FIG. 9. As can be seen from FIG. 9, the second experimental example has shown that both Samples #1 to #4 in each of which the pure Cu film is used and Samples #5 to #8 in each of which the Cu alloy film is used, have approximately the same resistance values.

Figure 10B:
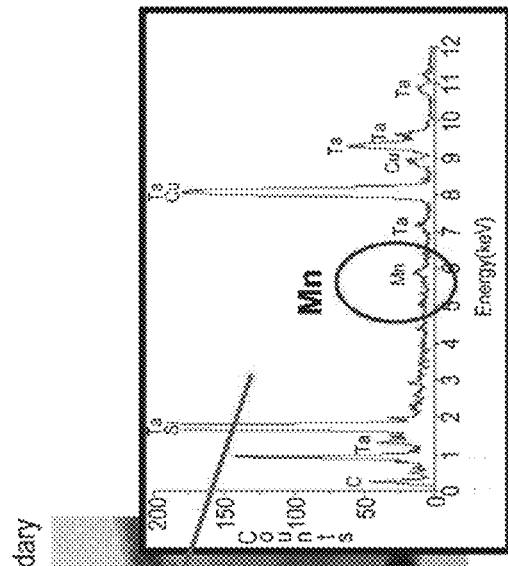
FIGS. 10A and 10B are TEM photographs showing cross sections of Samples of FIG. 9 and the results of element analysis which are observed with an EDX installed in the TEM.
Figure 10A:
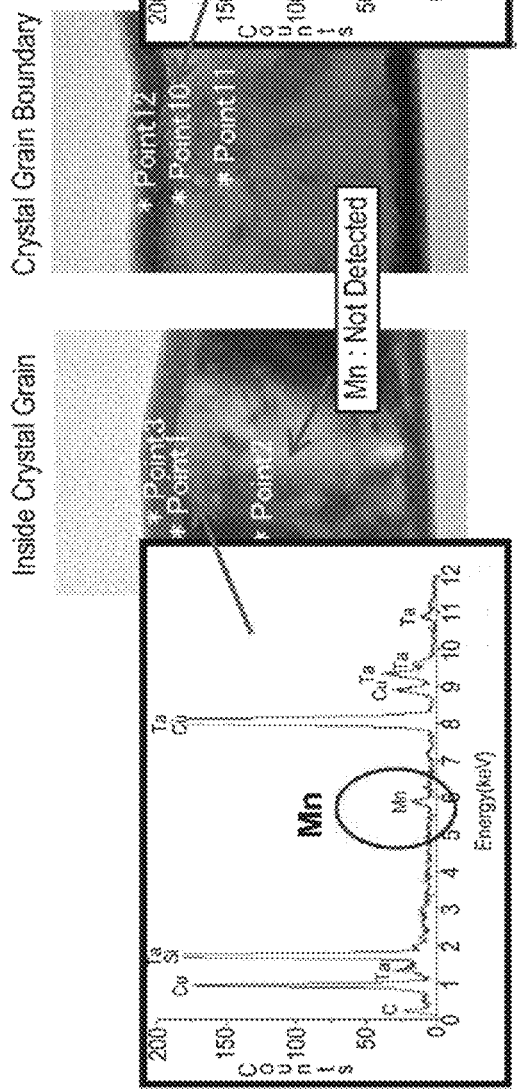

FIGS. 10A and 10B are transmission electron microscope (TEM) photographs showing cross sections of Samples in which a CuMn alloy film (i.e., a Cu alloy film containing 2 Mn atoms) is formed. In addition, the results of element analysis which are observed with an energy dispersive X-ray spectroscopy (EDX) installed in the TEM, are shown FIGS. 10A and 10B. As can be seen from FIGS. 10A and 10B, Mn was detected both in a crystal grain (FIG. 10A) and at a crystal grain boundary (FIG. 10B) in the vicinity of the dielectric cap layer, but was not detected in bulk portions.

The second experimental example has shown that although the Cu alloy film is formed on the CVD-based Ru liner film to bury the trench, alloy components in the Cu wiring are drastically reduced, thus allowing the Cu wiring to have the same resistance value as the wiring obtained using the pure Cu film.

Third Experimental Example

The following is a description of a third experimental example where Samples E to H were prepared. A wafer W in this experimental example includes an interlayer dielectric film having a line-and-space pattern formed therein. Sample E was prepared to have a Cu wiring which is formed by: forming a PVD-based TaN barrier film and a CVD-based Ru liner film on the wafer; forming a PVD-based pure Cu film using a pure Cu target to bury a trench; and forming a dielectric (SiCN) cap layer by CMP and CVD. Sample F was prepared to have a Cu wiring which is formed by: forming a PVD-based TaN barrier film and a CVD-based Ru liner film on the wafer; forming a PVD-based Cu alloy film (containing 2 Mn atoms) using a CuMn alloy target to bury a trench; and forming a dielectric (SiCN) cap layer by CMP and CVD. Sample G was prepared to have a Cu wiring which is formed by: forming a PVD-based TaN barrier film on the wafer; forming a pure Cu seed film by PVD; burying a trench by Cu plating; and forming a dielectric (SiCN) cap layer by annealing using CMP and CVD processes. Sample H was prepared to have a Cu wiring which is formed by: forming a PVD-based TaN barrier film on the wafer; forming a seed film made of Cu-2 at % Mn alloy by PVD; burying a trench by Cu plating; and forming a dielectric (SiCN) cap layer by annealing using CMP and CVD processes. For each of Samples E to H, a wiring resistance (R), an inter-wiring capacitance (C), and an electro-migration (EM) resistance were measured. In addition, Samples having L/S=100 nm/100 nm was used in measuring the wiring resistance (R) and the inter-wiring capacitance (C), and Sample having L/S=140 nm/140 nm was used in measuring the EM resistance.

Figure 11:
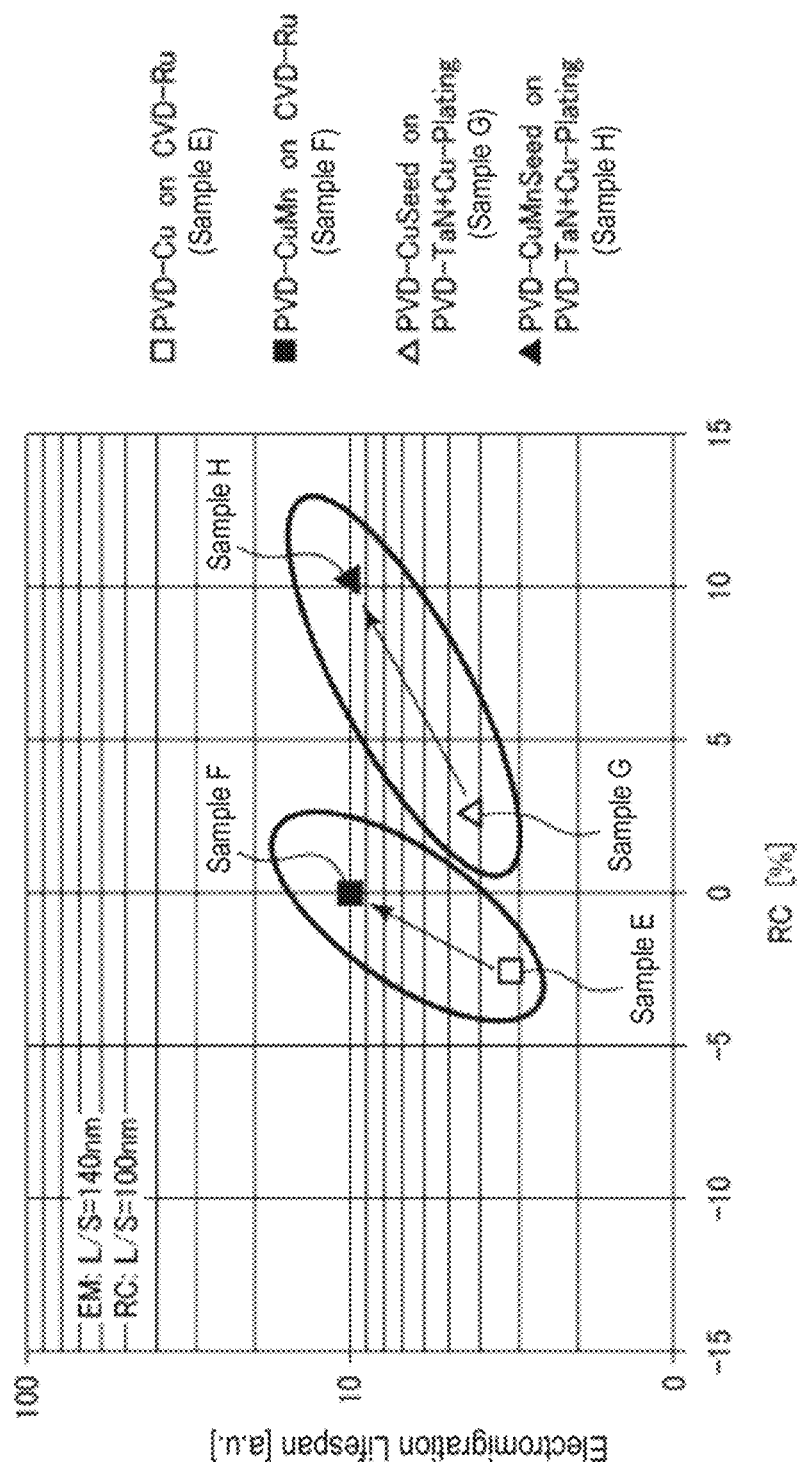
FIG. 11 is a graph showing a relationship between a product of a wiring resistance and an inter-wiring capacitance and an electro-migration lifespan in Samples are prepared to have a Cu wiring obtained by: forming a pure Cu film on a CVD-based Ru liner film by PVD; forming a CuMn alloy film on a CVD-based Ru liner film by PVD; forming a pure Cu seed film on a PVD-based TaN film to bury a trench by Cu plating; and forming a CuMn alloy seed film on a PVD-based TaN film to bury a trench by Cu plating, respectively.

FIG. 11 is a graph showing a relationship between a product ("RC") of the wiring resistance (R) and the inter-wiring capacitance (C) and an electro-migration lifespan. In addition, since the inter-wiring capacitances (C) of all Samples are approximately identical to each other, a value of the respective RC represents a difference between the respective wiring resistances (R).

As can be seen from FIG. 11, it has been observed that both Sample F obtained by forming the CVD-based Ru liner film and then burying the trench with the CuMn alloy by PVD, and Sample H obtained by forming the CuMn alloy seed film by PVD and then burying the trench by Cu plating, manifests a more remarkably improved electro-migration lifespan than both Sample E obtained by burying the trench with the pure Cu film and Sample G obtained by burying the trench with the pure Cu seed film. Further, it has been observed that Sample H obtained by using the CuMn alloy seed film has a drastically increased RC value as compared with Sample G obtained by using the pure Cu seed film, whereas Sample F obtained by forming the CVD-based Ru liner film and then burying the trench with the CuMn alloy by PVD has a negligible increase in RC as compared with Sample E obtained by burying the trench with the pure Cu film by PVD, and has a smaller RC value than Sample G obtained by burying the trench by Cu plating after the pure Cu seed film is used. From this observation, it could be seen that that the Cu wiring is formed by forming the CVD-based Ru liner film and then burying the trench with the CuMn alloy by PVD, thus achieving both an improvement in the electro-migration resistance and a reduction in wiring resistance.

Fourth Experimental Example

Figure 12:
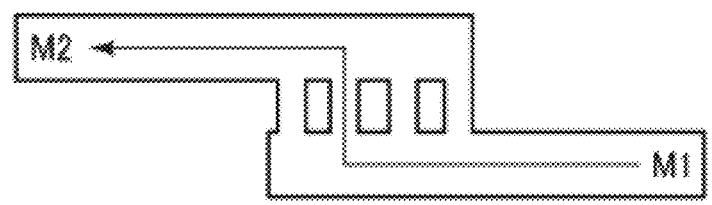
FIG. 12 is a view showing a pattern used for evaluation of reliability.

The following is a description of a fourth experimental example where reliability of a wafer having a Cu wiring formed therein was evaluated, wherein the wafer has a test pattern (a wiring width of 140 nm and a via diameter of 120 nm) as shown in FIG. 12. In this experimental example, Samples I to K were prepared. Sample I was prepared to have a Cu wiring which is obtained by: forming a PVD-based TaN barrier film and a CVD-based Ru liner film on the wafer; forming a PVD-based pure Cu film using a pure Cu target to bury a trench; and forming a dielectric (SiCN) cap layer by CMP and CVD. Sample J was prepared to have a Cu wiring which is obtained by: forming a PVD-based TaN barrier film and a CVD-based Ru liner film on the wafer; forming a PVD-based Cu alloy film (containing 2 Mn atoms) using a CuMn alloy target to bury a trench; and forming a dielectric (SiCN) cap layer by CMP and CVD. Sample K was prepared to have a Cu wiring which is obtained by: forming a PVD-based TaN barrier film on the wafer; forming a PVD-based Cu alloy seed film (containing 2 Mn atoms); burying a trench by Cu plating; and forming a dielectric (SiCN) cap layer by annealing, CMP and Chemical Mechanical Deposition (CVD) processes. Thereafter, the reliability of these Samples I to K as the wafers W were performed.

Figure 13:
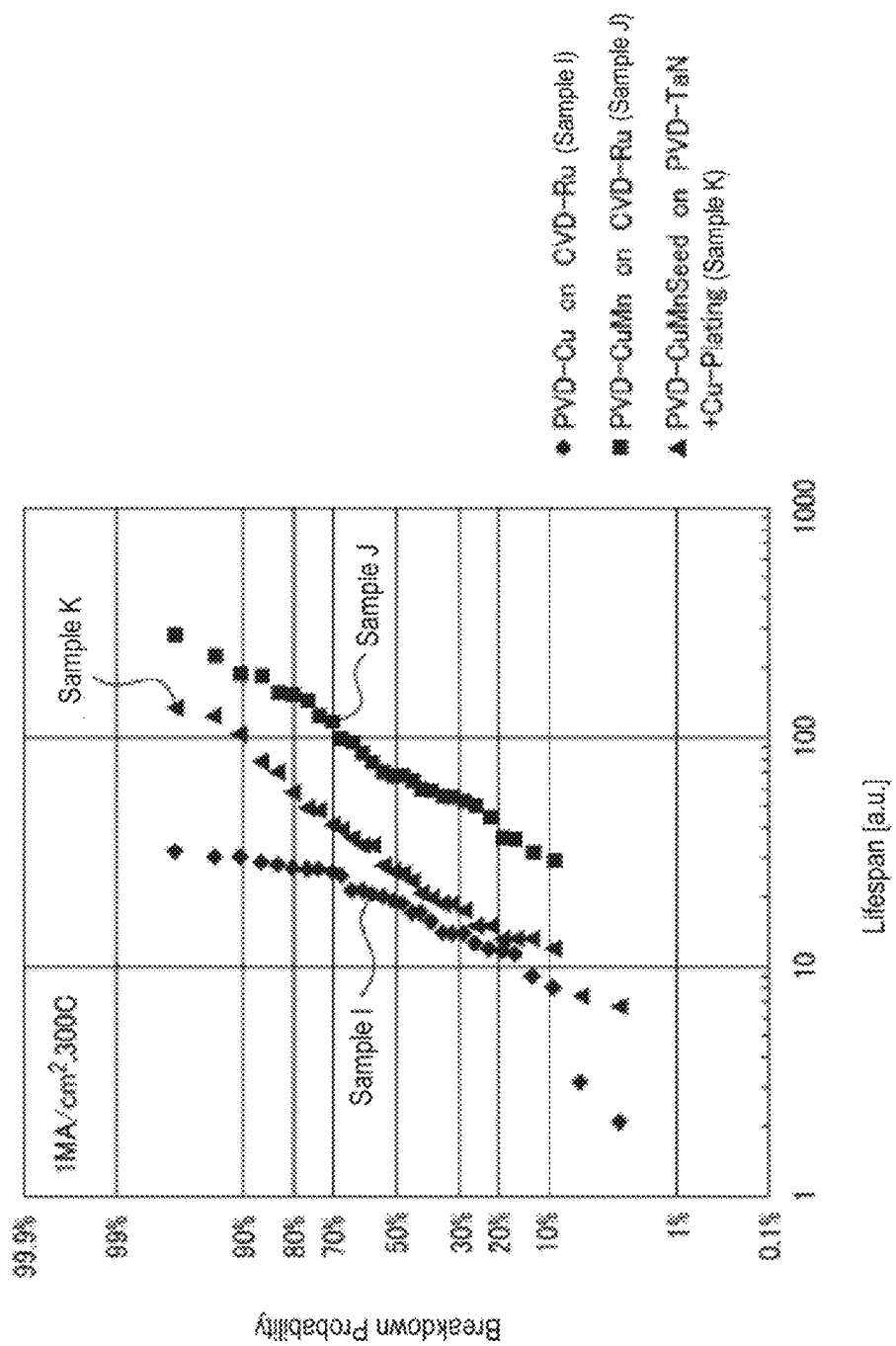
FIG. 13 is a view showing a relationship between an electro-migration lifespan and a breakdown probability in Samples that were prepared to have a Cu wiring obtained by: forming a pure Cu film on a CVD-based Ru liner film by PVD; forming a CuMn alloy film on a CVD-based Ru liner film by PVD; and forming a CuMn alloy seed film on a PVD-based TaN film to bury a trench by Cu plating, respectively, each of Samples having the pattern shown in FIG. 12.

The reliability evaluation was performed under conditions of 300 degrees C. and 1 MA/cm². A relationship between an electro-migration lifespan and a breakdown probability in the evaluation is shown in FIG. 13. As shown in FIG. 13, it has been observed that Sample J obtained by forming the alloy film of Cu-2 at % Mn on the CVD-based Ru liner film by PVD to bury the trench according to this embodiment has a more remarkably improved EM resistance than Sample I obtained by forming the pure Cu film by PVD to bury the trench, and has a higher EM resistance than Sample K obtained by the CuMn alloy seed film to bury the trench by Cu plating.

For Sample J which had undergone the reliability evaluation, element analysis in a cross section thereof was performed using EDX installed in the TEM. As a result, it has been observed that Mn is segregated toward an interface between the dielectric cap layer and the Cu wiring 208 and into the Ru liner film 205, and Mn is hardly present in the bulk portion of the Cu wiring 208.

Figure 14:
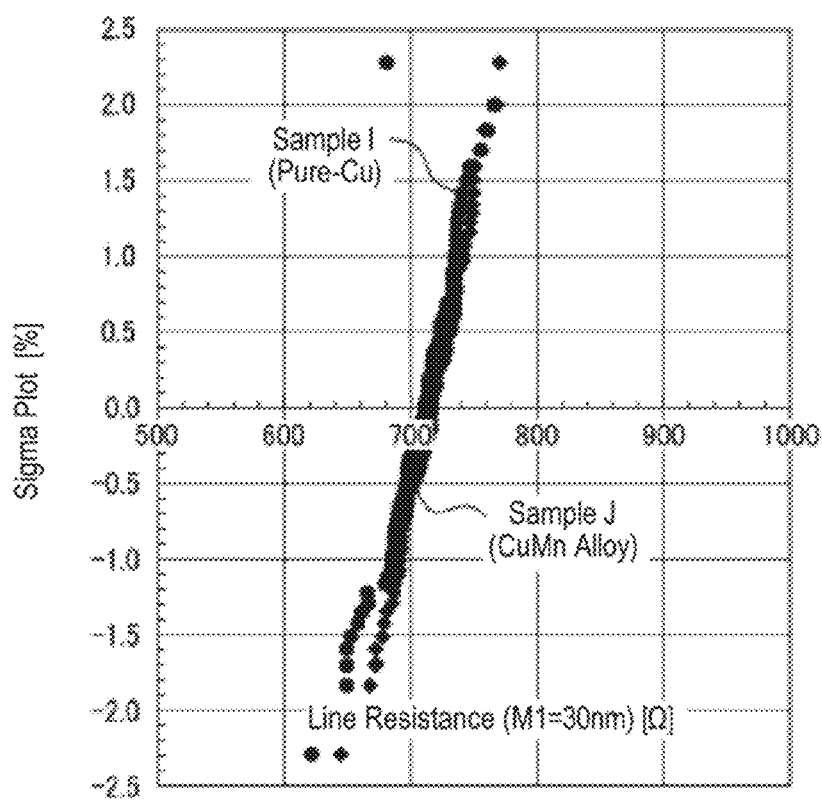
FIG. 14 is a view showing a sigma plot of line resistance in Samples each of which is prepared to have a Cu wiring obtained by forming a pure Cu film on a CVD-based Ru liner film using PVD; and by forming a CuMn alloy film on a CVD-based Ru liner film using PVD, each of the Samples having the pattern shown in FIG. 12.

Next, a test was performed to measure line resistances of Samples I and J using a test pattern M1 of 30 nm (equivalent to L/S=60 nm/60 nm) as shown in FIG. 12. FIG. 14 is a view showing a sigma plot for measured line resistances. As shown in FIG. 14, it has been observed that Sample J obtained by forming the alloy film of Cu-2 at % Mn on the CVD-based Ru liner film to bury the trench by PVD according to this embodiment has line resistances equal to Sample I obtained by forming the pure Cu film to bury the trench by PVD, as a function of a line width.

Figure 15:
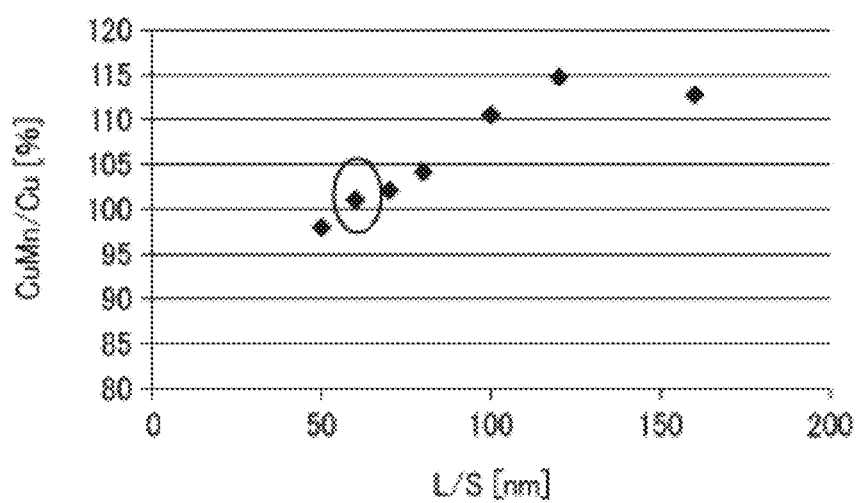
FIG. 15 is a view showing a ratio of a line resistance of a Sample that was prepared to have a Cu wiring obtained by forming a CuMn alloy film on a CVD-based Ru liner film by PVD, to a line resistance of a Sample obtained by using a pure Cu film, as a function of a line- and space (L/S) width.

Similarly, the line resistances of Samples I and J were measured as a function of an L/S width. FIG. 15 is a view showing a ratio of a line resistance of Sample I obtained by using the CuMn alloy film to a line resistance of Sample J obtained by using the pure Cu film. As shown in FIG. 15, it has been observed that when the L/S width is small, the line resistance of Sample I is equal to that of Sample J, but as the L/S width increases, the line resistance of Sample J is somewhat increased as compared with Sample I. However, it has been observed that a ratio of the increment is low, e.g., 15%.

OTHER APPLICATIONS

While the embodiments of the present disclosure have been described, the present disclosure may be modified without being limited to the above embodiments. For example, the film-forming system is not limited to that shown in FIG. 4, but may be a film-forming system in which all film-forming units are connected to a single transfer unit. Further, instead of the multi-chamber type system shown in FIG. 4, only some of the barrier film, the Ru liner film and the Cu alloy film are formed in the same film-forming system and the other may be formed in additional units while being subjected to atmosphere exposure. Alternatively, all the films may be formed in the additional units while being subjected to atmosphere exposure.

Furthermore, while the present disclosure illustrates the embodiments in which the present methods are adapted to a wafer having a trench and a via (hole), the present disclosure can of course be adapted to a wafer having only a trench or only a hole. Moreover, the present disclosure can be used for embodment in devices having a variety of structures such as a single damascene structure, a double damascene structure, a 3D mounting structure, or the like. In addition, while the embodiment exemplifies a semiconductor substrate as a target substrate, the silicon wafer may use a silicon wafer and a compound wafer including GaAs, SiC, GaN, etc., and instead of the semiconductor wafer, the present disclosure may of course be adapted to a glass substrate used for a Flat Panel Display (FPD) such as an LCD, a ceramic substrate, or the like.

According to the present disclosure, a Ru film is formed on a barrier film by CVD. Then, a Cu alloy film is formed on the Ru film by PVD. Subsequently, a recess is buried with the Cu alloy film. With this configuration, alloy components contained in the Cu alloy film are segregated in an interface between a dielectric film (dielectric cap layer) and a Cu wiring, thus enhancing adhesion between the dielectric cap layer and the Cu wiring. Accordingly, an electro-migration resistance of the Cu wiring is improved. Further, alloy components present in the Cu alloy film as impurities are diffused toward impurities (e.g., a small amount of oxygen) present in a CVD-based Ru liner film by virtue of heat generated when a series of the Cu wiring and the dielectric film are formed, so that they are caught on the impurities. Further, the PVD process may essentially cause less impurities than a plating process, and allows Cu crystal grains to be increased by heat generated in the course of the PVD-based film-forming. Accordingly, a Cu wiring having a reduced resistance can be obtained. Furthermore, after the Ru liner film having a high wettability with Cu is formed, the Cu alloy film is formed by PVD to bury the recess. Therefore, it is possible to obtain a sufficient burying property without generating voids which result from a Cu plating.

While certain embodiments have been described, these embodiments have been presented by way of example only, and are not intended to limit the scope of the disclosures. Indeed, the novel methods and units described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a copper (Cu) wiring in a recess formed to have a predetermined pattern in an insulating film formed on a surface of a substrate, the method comprising:
    forming a barrier film at least on a surface of the recess, the barrier film serving as a barrier for blocking diffusion of Cu;
    forming a Ru film on the barrier film by Chemical Mechanical Deposition (CVD);
    forming a Cu alloy film directly on the Ru film by Physical Vapor Deposition (PVD) to bury the recess;
    forming a Cu wiring using the Cu alloy film buried in the recess; and
    forming a dielectric film on the Cu wiring,
        wherein the forming the Cu alloy film includes: supplying a plasma-generating gas into a processing chamber in which the substrate is received to generate plasma; scattering grains from a target made of the same material as that of the Cu alloy film; allowing the grains to pass through the plasma for ionization of the grains; and applying a bias power such that the ionized grains are attracted onto the substrate.

2. A method of forming a copper (Cu) wiring in a recess formed to have a predetermined pattern in an insulating film formed on a surface of a substrate, the method comprising:
    forming a barrier film at least on a surface of the recess, the barrier film serving as a barrier for blocking diffusion of Cu;
    forming a Ru film on the barrier film by Chemical Mechanical Deposition (CVD);
    forming a Cu alloy film directly on the Ru film by Physical Vapor Deposition (PVD) to bury the recess;
    forming a Cu wiring using the Cu alloy film buried in the recess; and
    forming a dielectric film on the Cu wiring,
        wherein the forming the Cu wiring includes: forming an overburdened layer on the Cu alloy film; and polishing the entire surface of the overburdened layer.

3. The method of claim 2, wherein the overburdened layer is formed by forming the Cu alloy film or a pure Cu film on the Cu alloy film by PVD.

4. The method of claim 2, wherein the forming the overburdened layer is performed by a Cu plating.

5. The method of claim 2, wherein after the Cu alloy film is formed, the overburdened layer is formed of the same material as that of the Cu alloy film using a same unit that is used in forming the Cu alloy film.

6. The method of claim 1, wherein the material of the Cu alloy film is one selected from a group consisting essentially of Cu—Mn, Cu—Al, Cu—Mg, Cu—Ag, Cu—Sn, Cu—Pb, Cu—Zn, Cu—Pt, Cu—Au, Cu—Ni, Cu—Co and Cu—Ti.

7. The method of claim 1, wherein the barrier film is one selected from a group consisting essentially of a Ti film, TiN film, Ta film, TaN film, two-layered film of Ta/TaN, TaCN film, W film, WN film, WCN film, Zr film, ZrN film, V film, VN film, Nb film, and NbN film.

8. A non-transitory computer-readable storage medium operating in a computer and storing a program for controlling a Cu wiring forming system,
    wherein when the program is executed by the computer, the program controls the Cu wiring forming system to perform a method of forming a copper (Cu) wiring in a recess formed to have a predetermined pattern in an insulating film formed on a surface of a substrate, the method including:
        forming a barrier film at least on a surface of the recess, the barrier film serving as a barrier for blocking diffusion of Cu;
        forming a Ru film on the barrier film by Chemical Mechanical Deposition (CVD);
        forming a Cu alloy film directly on the Ru film by Physical Vapor Deposition (PVD) to bury the recess;
        forming a Cu wiring using the Cu alloy film buried in the recess; and
        forming a dielectric film on the Cu wiring,
    wherein the forming the Cu alloy film includes: supplying a plasma-generating gas into a processing chamber in which the substrate is received to generate plasma; scattering grains from a target made of the same material as that of the Cu alloy film; allowing the grains to pass through the plasma for ionization of the grains; and applying a bias power such that the ionized grains are attracted onto the substrate.

* * * * *